United States Patent
Yanata et al.

(10) Patent No.: US 9,735,757 B2
(45) Date of Patent: Aug. 15, 2017

(54) PIEZOELECTRIC DEVICE

(71) Applicant: TDK CORPORATION, Tokyo (JP)

(72) Inventors: Takeshi Yanata, Tokyo (JP); Yo Saito, Tokyo (JP); Kazuto Takeya, Tokyo (JP); Katsunari Moriai, Tokyo (JP); Takashi Inagaki, Tokyo (JP); Takahiro Itami, Tokyo (JP); Takeshi Oyanagi, Tokyo (JP); Hitoshi Ishida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 449 days.

(21) Appl. No.: 14/596,696

(22) Filed: Jan. 14, 2015

(65) Prior Publication Data
US 2015/0249199 A1   Sep. 3, 2015

(30) Foreign Application Priority Data

Feb. 28, 2014 (JP) .................................. 2014-039318

(51) Int. Cl.
*H01L 41/053* (2006.01)
*H03H 9/10* (2006.01)

(52) U.S. Cl.
CPC ......... *H03H 9/1021* (2013.01); *H01L 41/053* (2013.01)

(58) Field of Classification Search
CPC ................................................. H01L 41/053

USPC ......................................... 310/340, 344, 348
See application file for complete search history.

(56) References Cited

U.S. PATENT DOCUMENTS

2009/0224634 A1* 9/2009 Murakami ........... H03H 9/1021
310/348

FOREIGN PATENT DOCUMENTS

JP        2001-144201 A    5/2001

* cited by examiner

*Primary Examiner* — Derek Rosenau
(74) *Attorney, Agent, or Firm* — Oliff PLC

(57) ABSTRACT

A piezoelectric device has: a ceramic substrate having a first principal surface and a second principal surface opposed to each other; a piezoelectric element arranged on the first principal surface; a frame having a first face and a second face opposed to each other and arranged on the ceramic substrate so as to surround the piezoelectric element; a metal layer arranged on the second face of the frame; and a metal lid arranged on the metal layer so as to close a space surrounded by the frame. The first face of the frame is in contact with the first principal surface of the ceramic substrate. The metal layer and the metal lid are joined to each other by resistance welding. The frame has a composite portion containing a metal and a metal oxide and the composite portion includes the second face and is in contact with the metal layer.

3 Claims, 6 Drawing Sheets

PIEZOELECTRIC DEVICE

BACKGROUND OF THE INVENTION

Field of the Invention

The present invention relates to a piezoelectric device.

Related Background Art

A quartz crystal oscillator using the quartz crystal is known as one of piezoelectric vibration devices having a piezoelectric element. There is the known quartz crystal oscillator having a package composed of a tabular ceramic layer and a frame-shaped ceramic layer arranged on the tabular ceramic layer, a metal lid arranged so as to close an opening of the package, and a quartz. resonator as a piezoelectric element (e.g., cf. Japanese Patent Application Laid-open Publication No. 2001-444201). The quartz resonator is arranged in a space surrounded by the package and the lid.

SUMMARY OF THE INVENTION

In the Laid-open Publication No. 2001-144201, a metal sealing conductor is arranged on the opposite side of the frame-shaped ceramic layer to a surface thereof opposed to the tabular ceramic layer. The sealing conductor and the metal lid are joined together by resistance welding or the like, thereby forming the space for the quartz resonator to be arranged therein. The coefficient of thermal expansion of the frame-shaped ceramic layer is significantly different from that of the metal sealing conductor. For this reason, the frame-shaped ceramic layer can crack around a region where the sealing conductor is laid, during the operation of welding between the sealing conductor and the metal lid.

An object of the present invention is to provide a piezoelectric device capable of suppressing the crack generation.

A piezoelectric device according to the present invention comprises: a ceramic substrate having a first principal surface and a second principal surface opposed to each other; a piezoelectric element arranged on the first principal surface; a frame having a first surface and a second surface opposed to each other and being arranged on the ceramic substrate so as to surround the piezoelectric element; a metal layer arranged on the second surface of the frame; and a metal lid arranged on the metal layer so as to close a space surrounded by the frame, the first surface of the frame being in contact with the first principal surface of the ceramic substrate, the metal layer and the metal lid being joined to each other by resistance welding, the frame having a composite portion containing a metal and a metal oxide, and the composite portion including the second surface and is in contact with the metal layer.

In the piezoelectric device according to the present invention, the frame has the composite portion containing the metal and the metal oxide. For this reason, the composite portion has electric conductivity and thus can be subjected to electroplating. The composite portion is in contact with the metal layer arranged on the second surface. The metal layer becomes bound with the metal contained in the composite portion, whereby the metal layer can be prevented from being peeled off from the frame. The coefficient of thermal expansion of the composite portion becomes a value closer to that of the metal than that of a ceramic consisting of the pure metal oxide. This relieves thermal shock caused in the composite portion during the resistance welding of the metal layer and the metal lid to each other and suppresses the crack generation in the composite portion. Therefore, the present invention can provide the piezoelectric device capable of suppressing the crack generation.

The second surface of the frame may be a polished surface. In this case, flatness of the metal layer improves, so as to enhance sealing performance of the composite portion, the metal layer, and the metal lid.

The frame may be comprised of the composite portion.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The embodiment of the present invention will be described below in detail with reference to the accompanying drawings. In the description, identical elements or elements with identical functionality will be denoted by the same reference signs, without redundant description.

Figure 1:
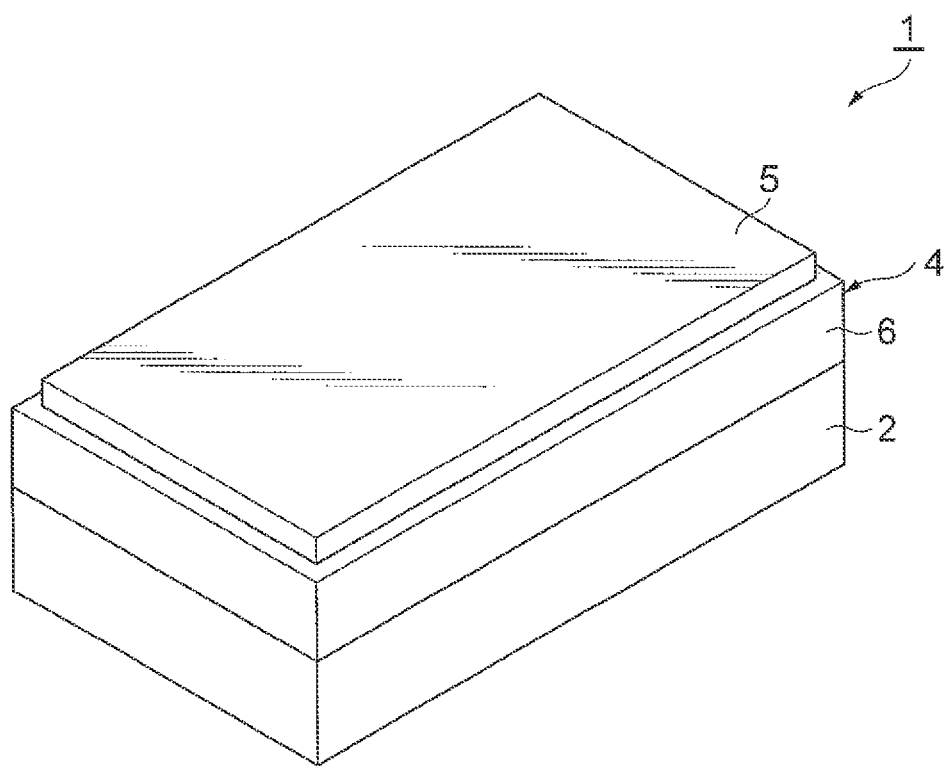
FIG. 1 is a perspective view showing a piezoelectric device according to an embodiment of the present invention.
Figure 2:
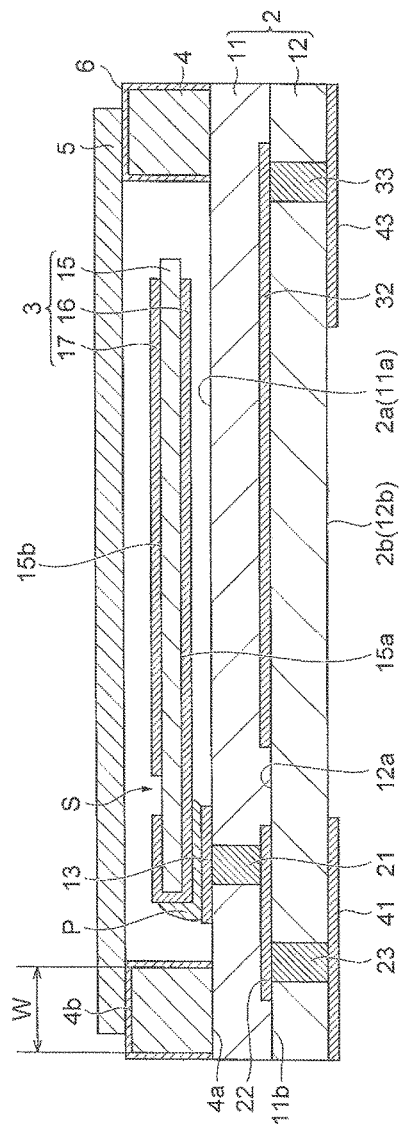
FIG. 2 is a drawing for explaining a cross-sectional configuration of the piezoelectric device according to the embodiment.
Figure 3:
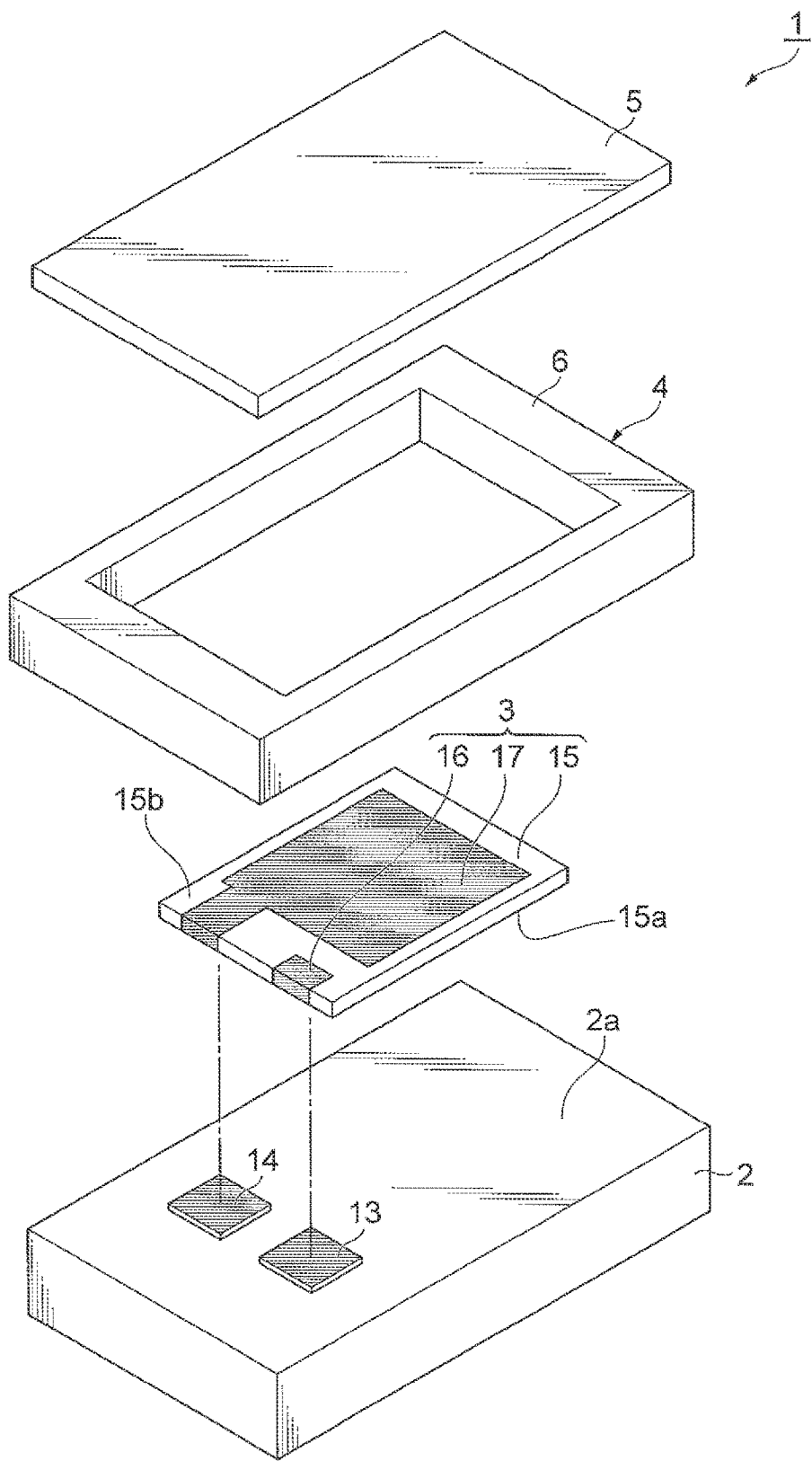
FIG. 3 is an exploded perspective view showing the piezoelectric device according to the embodiment.

The configuration of the piezoelectric device according to the present embodiment will be described with reference to FIGS. 1 to 3. FIG. 1 is a perspective view showing the piezoelectric device according to the present embodiment. FIG. 2 is a drawing for explaining the cross-sectional configuration of the piezoelectric device according to the present embodiment. FIG. 3 is an exploded perspective view showing the piezoelectric device according to the present embodiment. In FIG. 3, each of the electrodes 13, 14, 16, and 17 is hatched, for facilitating visualization of the electrodes 13, 14, 16, and 17.

As shown in FIGS. 1 to 3, the piezoelectric device 1 is a piezoelectric vibration device to oscillate at a predetermined frequency as displaced with application of AC voltage. The piezoelectric device 1 has a ceramic substrate 2, a piezoelectric element 3, a frame 4, and a metal lid 5. The exterior appearance of the piezoelectric device I is composed of the ceramic substrate 2, the frame 4, and the metal lid 5. The piezoelectric element 3 is housed in a space S surrounded by the frame 4.

The ceramic substrate 2 has a first principal surface 2a and a second principal surface 2b of a rectangular shape opposed to each other. The ceramic substrate 2 is a sintered body of a metal oxide (e.g., alumina ($Al_2O_3$), zirconia ($ZrO_2$), titania ($TiO_2$), or the like). In the description hereinbelow, the direction along the long sides of the first principal surface 2a and second principal surface 2b will be referred to as "longitudinal direction" of the ceramic substrate 2 (piezoelectric device 1), the direction along the short sides of the principal surfaces 2a, 2b as "width direction" of the ceramic substrate 2 (piezoelectric device 1), and the direction in which the first principal surface 2a and the second principal surface 2b are opposed to each other as "thickness direction" of the ceramic substrate 2 (piezoelectric device 1). The length of the first principal surface 2a and second principal surface 2b in the longitudinal direction is, for example, from 1.5 mm to 4 mm. The length of the first principal surface 2a and second principal surface 2b in the width direction is, for example, from 1 mm to 3 mm. The distance between the first principal surface 2a and the second principal surface 2b in the thickness direction (i.e., the thickness of the ceramic substrate 2) is, for example, from 0.1 mm to 0.4 mm.

The ceramic substrate 2 has a ceramic first substrate 11 of a rectangular shape and a ceramic second substrate 1 of a rectangular shape. The first substrate 11 and the second substrate 12 are laid on each other in the thickness direction. The first substrate 11 has a first principal surface 11a and a second principal surface 11b of a rectangular shape opposed to each other. The first principal surface 11a is equivalent to the first principal surface 2a of the ceramic substrate 2. The second substrate 12 has a first principal surface 12a and a second principal surface 12b of a rectangular shape opposed to each other. The second principal surface 12b is equivalent to the second principal surface 2b of the ceramic substrate 2. The second principal surface 11b of the first substrate 11 and the first principal surface 12a of the second substrate 12 are in contact with each other. The first substrate 11 and the second substrate 12 are sintered so as to be integrated with each other.

A pair of metal pad electrodes 13, 14 are arranged on the first principal surface 2a of the ceramic substrate 2. Each of the pad electrodes 13 and 14 is comprised, for example, of gold (Au), platinum (Pt), nickel (Ni), or the like. The pad electrode 13 is electrically connected to a terminal electrode 41 provided on the second principal surface 2b, through below-described conductor 21, relay electrode 22, and conductor 23. The pad electrode 14 is electrically connected to a terminal electrode 43 provided on the second principal surface 2b, through below-described conductor 31, relay electrode 32 and conductor 33. The terminal, electrodes 41, 43 are comprised of the same metal as the pad electrodes 13, 14.

The piezoelectric element 3 vibrates at the predetermined frequency with application of the AC voltage. The piezoelectric element 3 has a quartz crystal substrate 15, a metal electrode 16, and a metal electrode 17. The quartz crystal substrate 15 has a first principal surface 15a and a second principal surface 15b of a rectangular shape opposed to each other. The electrode 16 is arranged mainly on the first principal surface 15a. The electrode 17 is arranged mainly on the second principal surface 15b. The electrode 16 is connected to the pad electrode 13 through an intermediate layer of an electroconductive resin P. Similarly, the electrode 17 is also connected to the pad electrode 14 through an intermediate layer of the electroconductive resin (not shown). The electroconductive resin P is a resin containing electroconductive particles of a metal (e.g., gold (Au), silver (Ag), platinum (Pt), or nickel (Ni)) or the like. The pad electrodes 13, 14 function as pads for the piezoelectric element 3 to be mounted on the ceramic substrate 2 (i.e., as piezoelectric element mounting pads).

The frame 4 is arranged along each side of the first principal surface 2a. The frame 4 is comprised of a sintered body and is formed, for example, by firing a single-layer frame-shaped green body or a plurality of stacked frame-shaped green bodies. The frame 4 is configured so as to form the rectangular space S on the first principal surface 2a of the ceramic substrate 2 when viewed from the thickness direction. Namely, the frame 4 is a member of a rectangular frame shape defining the space S. The frame 4 has a first surface 4a and a second surface 4b opposed to each other. The first surface 4a is in contact with the first principal surface 2a of the ceramic substrate 2. The length of the frame 4 in the thickness direction is, for example, from 0.3 mm to 0.6 mm. The width W of the frame 4 is, for example, from 0.2 mm to 0.4 mm. The second surface 4b is polished with a polishing machine or the like. The piezoelectric element 3 is arranged on the first principal surface 2a of the ceramic substrate 2 so as to be housed in the space S.

The frame 4 is comprised of a composite portion containing a metal and a metal oxide, The composite portion is a sintered body of a complex material (composite material) containing at least the metal (e.g., gold (Au), silver (Ag), copper (Cu), palladium (Pd), or the like) and the metal oxide (e.g., alumina ($Al_2O_3$), zirconia ($ZrO_2$), titania ($TiO_2$), or the like). Therefore, the coefficient of thermal expansion of this composite material is a value closer to that of the metal than that of a ceramic comprised of the pure metal oxide. The metal is dispersed in the metal oxide of the frame 4 so as to form conductive paths in the frame 4. For this reason, the frame 4 has electric conductivity. The composite material may contain glass (e.g., silicon oxide or the like) as a binder for preventing the metal or the metal oxide from being detached. The metal oxide contained in the composite material may be the same as the metal oxide of the ceramic substrate 2.

A metal layer 6 is arranged on the surface of the frame 4. Namely, the piezoelectric device 1 has the metal layer 6. The metal layer 6 is comprised, for example, of a metal such as nickel (Ni) or gold (Au). The metal layer 6 is formed on the surface of the frame 4, for example, by electroplating. In this case, the metal of the metal layer 6 is bound with the metal contained in the frame 4, at the surface of the frame 4 (or at an interface between the frame 4 and the metal layer 6). The metal layer 6 needs only to be arranged at least on the second surface 4b of the frame 4. In the present embodiment, the metal layer 6 is arranged on the surface of the frame 4 except for the first surface 4a. The metal layer 6 may be formed by flash plating.

The metal lid 5 is arranged on the metal layer 6 so as to close the space S surrounded by the frame 4. The metal lid 5 is a member of a rectangular parallelepiped shape. The metal lid 5 is a lid made of a metal (e.g., nickel (Ni) or the like) or made of an alloy (e.g., Kovar (Fe—Ni—Co alloy) or the like). The metal lid 5 is joined to the metal layer 6 located on the second surface 4b, by resistance welding. This joining process is carried out, for example, by resistance seam welding with an electric current being made to flow through the metal lid 5 and the metal layer 6 (or the frame 4). On the view from the thickness direction the area of the metal lid 5 is smaller than the area of the first principal surface 2a of the ceramic substrate 2, but these areas may be set equal.

Figure 4:
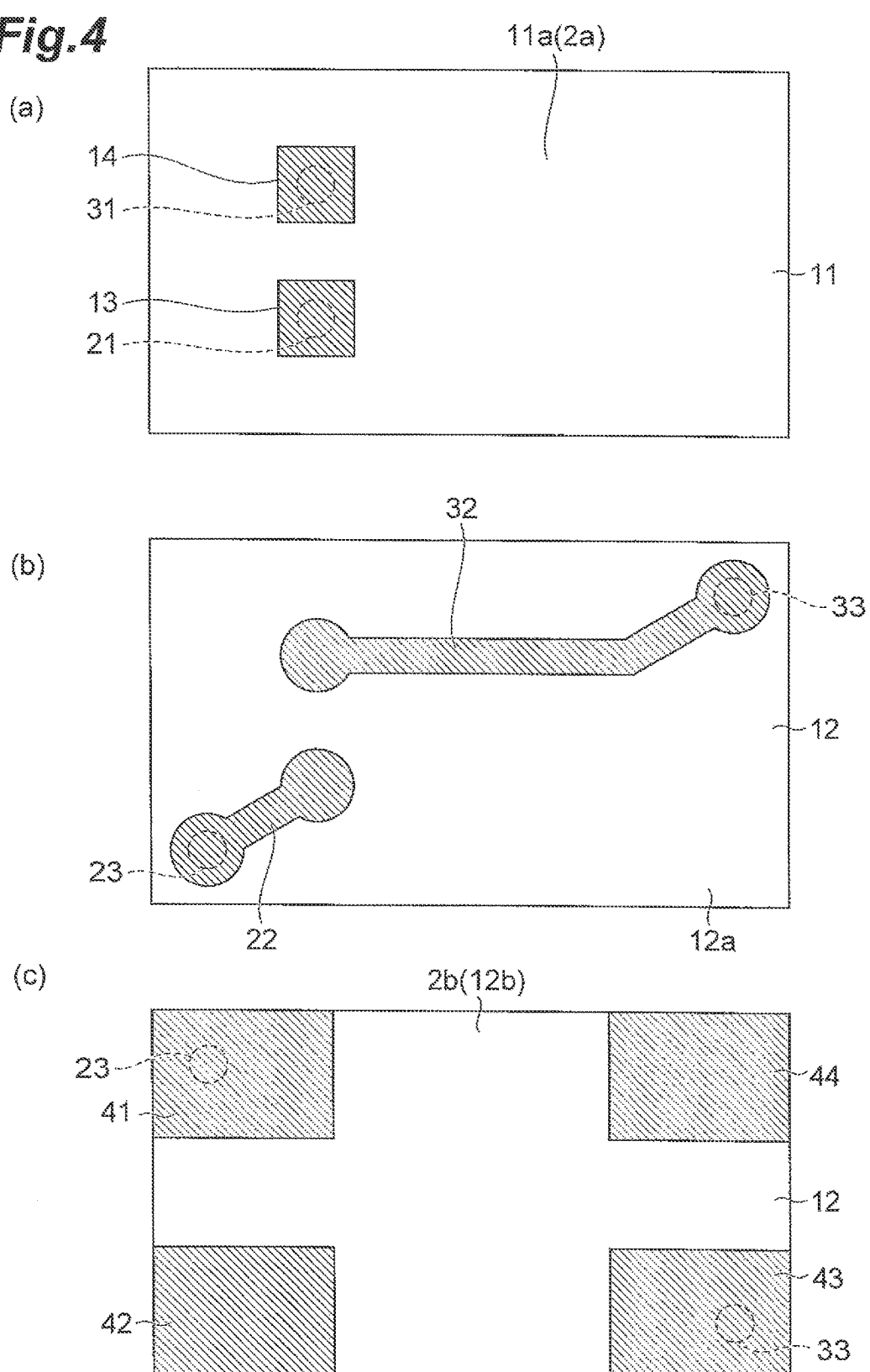
FIG. 4 is a drawing for explaining a planar configuration of a ceramic substrate.
Figure 5:
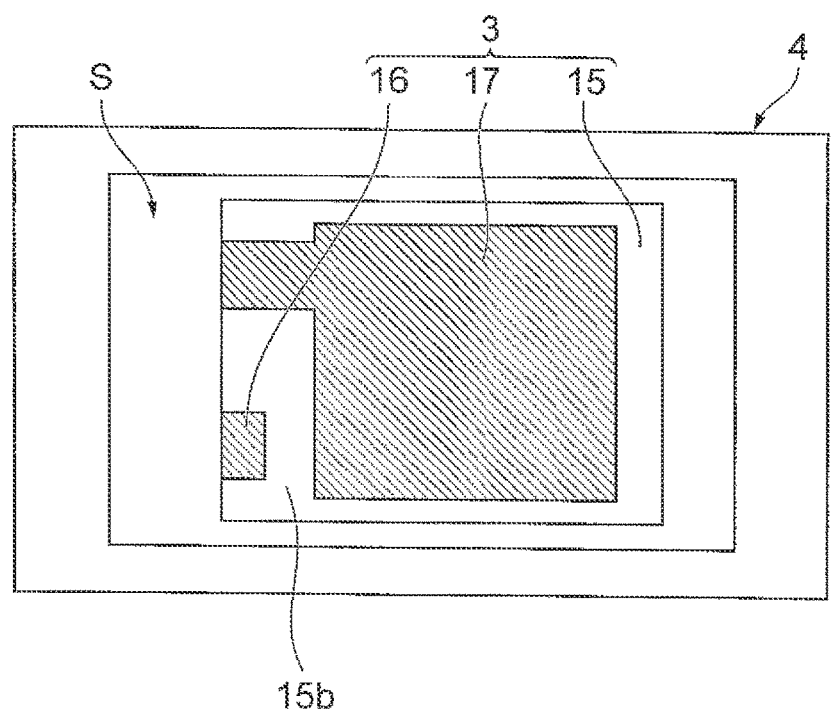
FIG. 5 is a drawing for explaining a planar configuration of a piezoelectric element and a frame.

The following will detail some of the constitutive elements of the piezoelectric device according to the present embodiment, with reference to FIGS. 2, 4, and 5. FIG. 4 is a drawing for explaining the planar configuration of the ceramic substrate. In FIG. 4, (a) is a plan view of the first substrate, (b) is a plan view of the second substrate, and (c) is a bottom view of the second substrate. FIG. 5 is a drawing for explaining the planar configuration of the piezoelectric element and the frame. In FIG. 4, each of the electrodes 13, 14, 22, 32, and 41-44 is hatched, for facilitating visualization of the electrodes 13, 14, 22, 32, and 41-44.

As shown in FIG. 2 and (a) of FIG. 4, the metal pad electrodes 13, 14 are arranged on the first principal surface 2a of the ceramic substrate 2 (the first principal surface 11a of the first substrate 11). A through hole penetrating in the thickness direction is formed at a portion of the first substrate 11 overlapping with the pad electrode 13. A conductor 21 is arranged in this through hole. Similarly, a through hole penetrating in the thickness direction is formed at a portion of the first substrate 11 overlapping with the pad electrode 14. A conductor 31 is arranged in this through hole. The conductors 21, 31 are comprised of the same metal as the pad electrodes 13, 14.

As shown in FIG. 2 and (b) of FIG. 4, the metal relay electrodes 22, 32 are arranged on the first principal surface 12a of the second substrate 12. The relay electrodes 22, 32 are separated on the first principal surface 12a and are electrically isolated from each other. The relay electrode 22 is connected to the conductor 21 arranged in the first substrate 11. The relay electrode 32 is connected to the conductor 31 arranged in the first substrate 11. A through hole penetrating in the thickness direction is formed at a portion of the second substrate 12 overlapping with the relay electrode 22. A conductor 23 is arranged in this through hole. Similarly, a through hole penetrating in the thickness direction is fanned at a portion of the second substrate 12 overlapping with the relay electrode 32. A conductor 33 is arranged in this through hole. The conductors 23, 33 are comprised of the same metal as the relay electrodes 22, 32.

As shown in FIG. 2 and (c) of FIG. 4, terminal electrodes 41 to 44 made of a metal are arranged on the second principal surface 2b of the ceramic substrate 2 (the second principal surface 12b of the second substrate 12). The terminal electrodes 41 to 44 are used. for the piezoelectric device 1 to be connected to and mounted on an external device. The terminal electrodes 41 to 44 have a rectangular shape when viewed from the thickness direction and are arranged corresponding to the respective corners of the second principal surface 12b. The terminal electrode 41 is in contact with the conductor 23. Namely, the terminal electrode 41 is electrically connected to the pad electrode 13 through the conductor 21, relay electrode 22, and conductor 23. The terminal electrode 43 is in contact with the conductor 33. Namely, the terminal electrode 43 is electrically connected. to the pad electrode 14 through the conductor 31, relay electrode 32, and conductor 33. The terminal electrodes 41, 43 function as terminals for external connection.

As shown in FIGS. 2 and 5, the frame 4 is arranged on the first principal surface 2a of the ceramic substrate 2 so as to surround the piezoelectric element 3 When viewed from the thickness direction. The piezoelectric element 3 is housed in the space S so as not to touch the frame 4.

In the piezoelectric device 1, as described above, the frame 4 is comprised of the composite portion containing the metal and the metal oxide. For this reason, the frame 4 has electric conductivity and thus can be subjected to electroplating. The frame 4 is in contact with the metal layer 6 arranged on the second surface 4b. The metal layer 6 is bound with the metal contained in the frame 4, whereby the metal layer 6 can be prevented from being peeled off from the frame 4. The coefficient of thermal expansion of the frame 4 is the value closer to that of the metal than that of the ceramic comprised of the pure metal oxide. This relieves the thermal shock caused in the frame 4 during the resistance welding of the metal lid 5 and the metal. layer 6 to each other and prevents the crack generation in the frame 4. Therefore, the present embodiment can provide the piezoelectric device 1 capable of suppressing the crack generation.

The second surface 4b of the frame 4 is a polished surface. This improves flatness of the metal layer 6, so as to enhance the sealing performance of the frame 4, the metal layer 6, and the metal lid 5.

Figure 6:
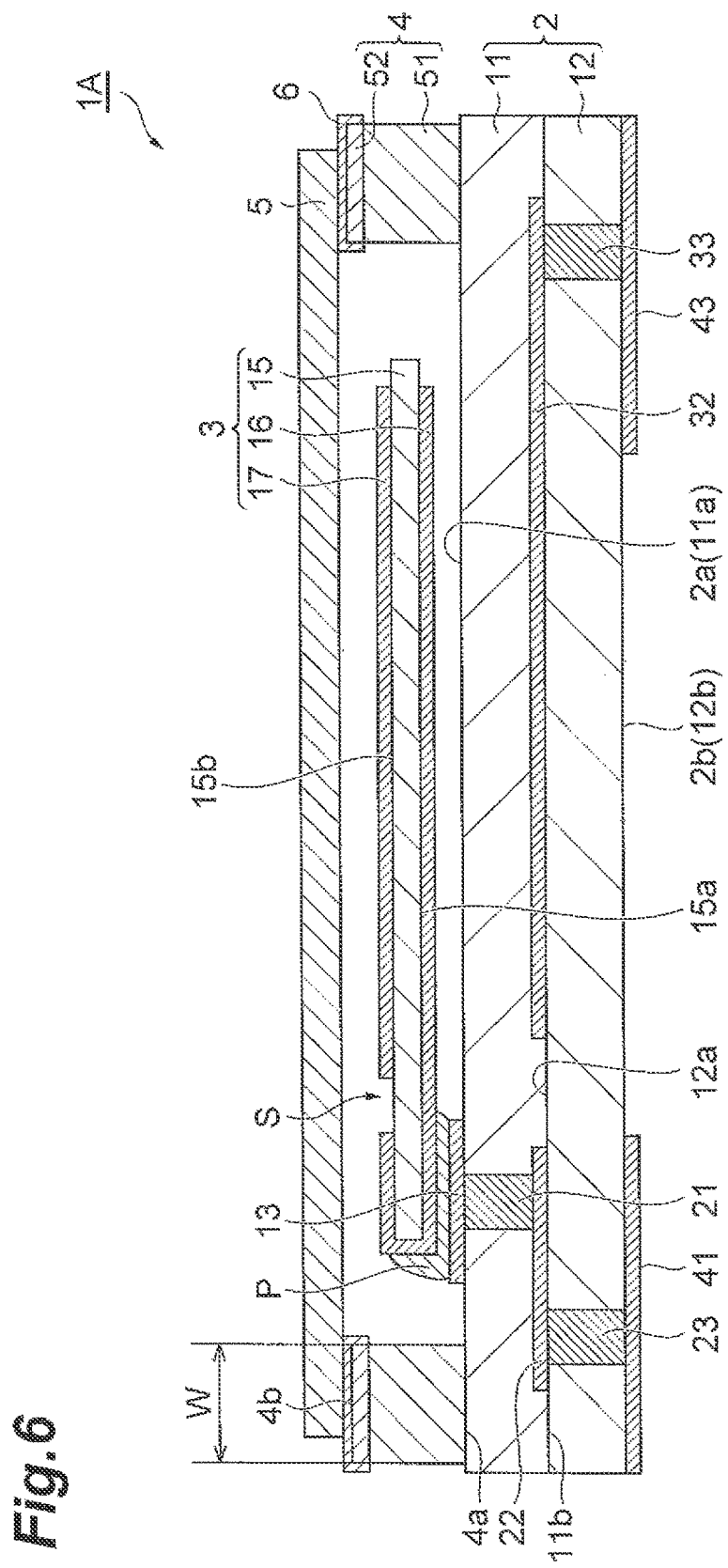
FIG. 6 is a drawing for explaining a cross-sectional configuration of the piezoelectric device according to a modification example of the embodiment.

The below will describe the piezoelectric device 1A according to a modification example of the aforementioned. embodiment, with reference to FIG. 6. FIG. 6 is a drawing for explaining the cross-sectional configuration of the piezoelectric device according to the modification example of the embodiment. The piezoelectric device 1A of the modification example has the same structure in many respects as the piezoelectric device 1 of the foregoing embodiment. For this reason, only differences from the above embodiment will be described in detail, while omitting the description of the same portions.

As shown in FIG. 6, the piezoelectric device 1A has the ceramic substrate 2, the piezoelectric element 3, the frame 4, the metal lid 5, and the metal layer 6 as the piezoelectric device 1 does. The frame 4 has a ceramic portion 51 and a composite portion 52 stacked. The ceramic portion 51 is a sintered body of a metal oxide (e.g., alumina ($Al_2O_3$), zirconia ($ZrO_2$) titania ($TiO_2$), or the like). The ceramic portion 51 is in contact with the first principal surface 2a of the ceramic substrate 2. The ceramic portion 51 is formed by firing a single-layer frame-shaped green body or a plurality of stacked frame-shaped green bodies. The composite portion 52 is a sintered body of a composite material containing a metal (e.g., gold (Au), silver (Ag), copper (Cu), palladium (Pd), or the like) and a metal oxide (e.g., alumina ($Al_2O_3$), zirconia ($ZrO_2$), titania ($TiO_2$), or the like). Therefore, the coefficient of thermal expansion of the composite portion 52 is also a value closer to that of the metal than that of a ceramic comprised of the pure metal oxide. The metal is dispersed in the metal oxide of the composite portion 52 so as to form conductive paths in the composite portion 52. The composite portion 52 may contain glass (e.g., silicon oxide or the like) as a binder for preventing the metal or the metal oxide from being detached. The composite portion 52 is arranged on the metal lid 5 side with respect to the ceramic portion 51 in the thickness direction. Namely, the composite portion 52 includes the second surface 4b. The ceramic portion 51 includes the first surface 4a. The percentage of the volume of the composite portion 52 with respect to the entire frame 4 is, for example, from 5% to 95%. The metal oxide of the ceramic portion 51 may be the same as the metal oxide of the composite portion 52. In this case, improvement is made in binding performance between the ceramic portion 51 and the composite portion 52. The ceramic portion 51 and the composite portion 52 may be formed by co-firing.

The metal layer 6 is arranged so as to cover only the composite portion 52. The reason for it is that the metal layer 6 is formed by electroplating, i.e., formed by binding of metal ions in a plating solution with the metal in the composite portion 52. Therefore, the metal layer 6 is selectively formed so as to cover only the composite portion 52. The metal layer 6 is arranged on the surface of the composite portion 52, except for the surface in contact with the ceramic portion 51. The metal layer 6 needs only to be arranged at least on the second surface 4b.

In the piezoelectric device 1A, as described above, the metal layer 6 is also bound with the metal contained in the composite portion 52, whereby the metal layer 6 can be prevented from being peeled off from the composite portion 52. This relieves the thermal shock caused in the frame 4 during the resistance welding of the metal lid 5 and the metal layer 6 to each other and prevents the crack generation in the frame 4. Therefore, the present modification example can also provide the piezoelectric device 1A capable of suppressing the crack generation. Since the percentage of the composite portion 52 is low in the frame 4, it becomes feasible to reduce a consumed amount of the metal in e piezoelectric device 1A.

The embodiment of the present invention was described above and it should be noted that the present invention is by no means intended to be limited to the above embodiment and can be modified in many ways without departing from the spirit and scope of the invention.

For example, the planar shape of the ceramic substrate 2 does not have to be limited to the rectangular shape shown in FIG. 2. The planar shape of the ceramic substrate 2 may be a shape other than the rectangular shape (e.g., a circular, hexagonal, or other shape), so as to fit a portion to which the piezoelectric device 1 is applied. In this regard, the planar shape of the space S defined by the frame 4 may be a shape other than the rectangular shape (e.g., a circular, hexagonal, or other shape).

The second surface 4b of the frame 4 may not be the polished surface. For example, the second surface 4b may be a natural surface. The natural surface is a surface comprised of surfaces of crystal grains grown by firing. However, the second surface 4b is preferably the polished surface, in order to ensure the flatness of the metal layer 6.

What is claimed is:

1. A piezoelectric device comprising:
   a ceramic substrate having a first principal surface and a second principal surface opposed to each other;
   a piezoelectric element arranged on the first principal surface;
   a frame having a first surface and a second surface opposed to each other and being arranged on the ceramic substrate so as to surround the piezoelectric element;
   a metal layer arranged on the second surface of the frame; and
   a metal lid arranged on the metal layer so as to close a space surrounded by the frame,
   wherein the first surface of the frame is in contact with the first principal surface of the ceramic substrate,
   wherein the metal layer and the metal lid are joined to each other by resistance welding, and
   wherein the frame has a composite portion containing a metal and a metal oxide and the composite portion includes the second surface and is in contact with the metal layer.

2. The piezoelectric device according to claim 1, wherein the second surface of the frame is a polished surface.

3. The piezoelectric device according to claim 1, wherein the frame is comprised of the composite portion.

* * * * *